US009349484B2

(12) United States Patent
Verbruggen et al.

(10) Patent No.: US 9,349,484 B2
(45) Date of Patent: May 24, 2016

(54) SAMPLE-AND-HOLD CIRCUIT FOR AN INTERLEAVED ANALOG-TO-DIGITAL CONVERTER

(71) Applicant: IMEC VZW, Leuven (BE)

(72) Inventors: Bob Verbruggen, Kessel-lo (BE); Kazuaki Deguchi, Hyogo (JP); Jan Craninckx, Boutersem (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/808,267

(22) Filed: Jul. 24, 2015

(65) Prior Publication Data

US 2016/0027528 A1    Jan. 28, 2016

(30) Foreign Application Priority Data

Jul. 25, 2014    (EP) ..................................... 14178665

(51) Int. Cl.
*H03M 1/00*    (2006.01)
*G11C 27/02*    (2006.01)
*H03M 1/12*    (2006.01)

(52) U.S. Cl.
CPC ............. *G11C 27/02* (2013.01); *H03M 1/1245* (2013.01)

(58) Field of Classification Search
CPC ....... H03M 1/08; H03M 1/54; H03M 1/1061; H03M 1/124; H03M 1/1245; H03M 1/1215; G11C 27/02
USPC .................. 341/122, 118, 120, 155, 156, 123
See application file for complete search history.

(56) References Cited

U.S. PATENT DOCUMENTS

| 6,232,804 | B1 | 5/2001 | Shigenobu et al. | |
|---|---|---|---|---|
| 8,248,282 | B2 | 8/2012 | Payne et al. | |
| 8,466,818 | B1 * | 6/2013 | Johancsik | H03M 1/54 341/122 |
| 9,071,270 | B2 * | 6/2015 | Johancsik | H03M 1/54 |
| 2006/0186948 | A1 | 8/2006 | Kelly et al. | |
| 2009/0039924 | A1 | 2/2009 | Zanchi et al. | |
| 2013/0141261 | A1 | 6/2013 | Johancsik et al. | |

OTHER PUBLICATIONS

Payne, R., et al., "A 12b 1GS/s SiGe BiCMOS Two-Way Time-Interleaved Pipeline ADC," IEEE International Solid-State Circuits Conference, p. 182-184 (2011).
European Search Report, Application No. 14178665.7-1805.
A.M. Abo et al., "A 1.5-V, 10-bit, 14.3-MS/s CMOS Pipeline Analog-to-Digital Converter," JSSC, vol. 34, No. 5, (1999).

* cited by examiner

*Primary Examiner* — Lam T Mai
(74) *Attorney, Agent, or Firm* — McDonnell Boehnen Hulbert & Berghoff LLP

(57) ABSTRACT

The present disclosure relates to a sample-and-hold circuit includes a transistor arranged for switching between a sample mode and a hold mode and a bootstrap circuit arranged for maintaining in the sample mode a voltage level between a source terminal and a gate terminal of the transistor independent of the voltage at the source terminal and arranged for switching off the transistor in the hold mode. The bootstrap circuit includes a bootstrap capacitance arranged for being precharged to a given voltage during the hold mode, the bootstrap capacitance being connected between the source terminal and the gate terminal during the sample mode. In one example, the bootstrap circuit comprises a switched capacitor charge pump for generating the given voltage.

17 Claims, 5 Drawing Sheets

SAMPLE-AND-HOLD CIRCUIT FOR AN INTERLEAVED ANALOG-TO-DIGITAL CONVERTER

CROSS-REFERENCE TO RELATED APPLICATIONS

The present application is a non-provisional patent application claiming priority to European Patent Application No. 14178665.7 filed Jul. 25, 2014, the contents of which are hereby incorporated by reference.

FIELD OF THE DISCLOSURE

The present disclosure is generally related to the field of high speed analog-to-digital converters.

BACKGROUND

In software defined radio an Analog-to-Digital converter (ADC) needs in order to simplify automatic gain control (AGC) and to relax filtering requirements a speed of at least 200 MSamples/s and as much resolution as is feasible for a power budget of a few mW. In addition, since this ADC also needs to quantize much lower bandwidth standards, a dynamic solution is desirable.

For such high speed ADCs interleaving is widely used. In high speed interleaved ADCs the effective ADC sampling frequency is increased by operating multiple sub-ADCs alternately. Moreover, fully dynamic interleaved ADCs are of special interest, as their total power consumption is independent of the number of parallel channels and the speed requirements for each individual channel are relaxed. However, interleaved ADCs suffer in general from mismatches among channels, gain mismatch and bandwidth mismatch. DC offset and gain mismatch are frequency-independent and can thus easily be calibrated in the digital domain. Bandwidth mismatch is frequency dependent and requires complex algorithms to be calibrated digitally.

Bandwidth mismatch is caused by mismatch among the sampling capacitance and sampling switch resistance of the sampling circuit of the interleaved sub-ADCs. As the sampling capacitance and the sampling switch resistance form a low pass filter, bandwidth mismatch between the sampling circuits causes a different frequency response for each sub-ADC. Thus, the input signal will be attenuated differently, leading to errors at higher frequencies where the resulting low pass filter has a greater attenuation and delay effect on the input signals. Consequently, spurious tones are caused which limit the high frequency input performance of interleaved ADCs.

In addition to bandwidth mismatch between the interleaved sub-ADCs, sampling circuits have to be designed for sufficiently good linearity. Indeed, sampling circuits always introduce harmonic distortion, which in the frequency domain shows up as spurious tones at multiples of the applied signal frequency. Since this distortion is added directly to the sampled voltage, it affects the overall linearity of the converter. In "*A 1.5-V, 10-bit, 14.3-MS/s CMOS Pipeline Analog-to-Digital Converter*" (A. M. Abo et al., JSSC, Vol. 34, No. 5, May 1999) a bootstrapped sampling switch has been proposed which significantly reduces harmonic distortion introduced by the sampling. This bootstrapped switch approach, or some variation thereof, is used in nearly all ADC designs that target high linearity. The bootstrapped approach ensures signal independent switch resistance by providing an input independent gate-source voltage for the sampling switch.

A highly linear interleaved ADC thus needs to combine excellent harmonic linearity as well as excellent bandwidth matching between interleaved channels. The former can be achieved by designing a bootstrapped sampling switch with a high, signal independent sampling switch gate-source voltage. The latter can be achieved by adjusting the bandwidths of interleaved channels. This adjustment should happen without degrading the harmonic performance of the sampling stage.

FIG. 1 illustrates a typical sampling network 10 for a two-times interleaved ADC comprising a plurality of sampling circuits 1. Each sampling circuit 1 is composed of a bootstrap circuit 2 and a series connection of a sampling switch 11 and a sampling capacitor 12. During the tracking phase (CLKint1,2=1) the sampling switches turn on and the voltage on each sampling capacitor follows the input voltage $V_{in}$. Just after the hold phase starts (CLKint1,2=0), the switches 11 turn off and hold the sampled voltage. To obtain good linearity, many high performance ADCs typically use a bootstrap circuit 2 as shown in FIG. 2. During the hold phase (when $\phi$=1), a fixed charge voltage Vch is used to charge the bootstrap capacitor (Cbs) 21 and at the same time the bootstrap output Vbs is tied to the ground to turn off the sampling switch. During the tracking phase the bootstrap capacitor 21 is connected between the switch transistor input and its gate. Due to the charge stored into Cbs the bootstrap output voltage Vbs approximates Vin+Vch. The gate-source voltage Vgs of the switch transistor 11 is thus kept constant ($\cong$Vch). Maintaining constant Vgs reduces the signal dependent non-linearity of the sampling switch by maintaining a constant sampling switch resistance. The bandwidth of sampling circuit 1 is mainly defined by the product of the sampling switch on-resistance (Ron) and sampling capacitance (Cs). Therefore, the mismatch of these sampling circuits among interleaved channels is the main cause of the bandwidth mismatch. If somehow either Ron or Cs or both can be optimized to make the Ron*Cs product the same for all sampling circuits and constant across an input signal frequency range one can assure excellent bandwidth matching and harmonic linearity.

Conventionally, one tries to calibrate bandwidth mismatch by tuning the on-resistance of the sampling switch transistors. A possible implementation is given in US2013/141261. This application discloses a time-interleaved AD converter containing a number of sub-ADC circuits. Each sub-ADC circuit includes a sample-and-hold (S/H) circuit. To adjust the frequency response of each S/H circuit a bootstrap circuit is provided. The bootstrap circuit is used to maintain a relatively constant gate-to-source voltage across the sampling switch and thus to maintain the sample-and-hold circuit linearity. The bootstrap circuit efficiency can be adjusted with trim loads containing a capacitor bank, so that capacitance can be selectively added to the capacitance at the switch gate. Considering the parasitic capacitance (Cpar) connected to the bootstrap output, the gate voltage Vbs of the sampling switch is calculated as $$Vbs=Cbs/(Cbs+Cpar)*(Vin+Vch) \qquad (1)$$

Changing the capacitance value of either Cbs or Cpar as proposed in US2013/141261 obviously changes Vbs and thus the sampling circuit bandwidth.

There are two issues with this approach. First, adding trimmable loads to Cbs and Cpar inevitably degrades the harmonic performance of the sampling circuit, as the bootstrap circuit is highly dependent on parasitic capacitors on the top plate of Cbs and on the sampling switch gate. Since a trimmable load inevitably increases these parasitics, the harmonic distortion introduced by a bootstrap circuit with these trimmable loads would inevitably be worse than in a bootstrap circuit without such loads. Second, when the sampling switch gate is drawn to ground to implement the sampling instant, this switch injects some charge into the sampling capacitor. Since the injected charge is proportional to Vbs, which contains the term Cbs/(Cbs+Cpar)*Vin, this charge injection causes some channel gain mismatch if Cbs/(Cbs+Cpar) is not the same in both channels. As a result, linearity of the ADC might degrade at some frequencies even while it is optimized at another frequency. Since the effect of gain mismatch is independent of the input frequency, this is especially true at lower frequency input: the interleaving spur after calibration could be significantly degraded and becomes worse than an interleaving spur without calibration. This means the bandwidth mismatch calibration proposed in this prior art document does not work well if good linearity is also required across a wide input frequency range.

U.S. Pat. No. 8,248,282 presents a time-interleaved A/D converter having a track-and-hold (T/H) architecture with tunable bandwidth that can be adjusted from a blind bandwidth mismatch estimation. Each ADC branch comprises a bootstrap circuit coupled to its respective track-and-hold circuit. A controller provides a control voltage to the bootstrap circuit to control a gate voltage of the sampling switch to adjust the sampling switch impedance. The proposed solution primarily tunes the gate voltage of a transistor inserted between the bootstrap capacitor and the gate node of the sampling switch and the source voltage of the transistor disables the switch between the gate node of the sampling switch and the top plate of the bootstrap capacitor. Consequently, the primary tuning mechanism is the resistance between the top plate of the bootstrap capacitor and gate node, which modulates turn-off time of the sampling switch. The sampling switch gate voltage during tracking is only slightly affected, which means this solution does not directly compensate for variation in the on-resistance, but rather tries to compensate its effects.

In "*A 12b 1GS/s SiGe BiCMOS Two-Way Time-Interleaved Pipeline ADC*" (R. Payne et al., ISSCC2011, pp. 182-184) a bootstrap circuit with a DAC voltage power supply is disclosed. To ensure reliable operation without undue stress on the transistors in the bootstrap circuits, this DAC voltage input must necessarily be smaller than the nominal supply voltage of a given technology. This means that the DAC powering the bootstrap circuit can only tune the sampling bandwidth by reducing the Vch in the above-mentioned equation (1) for Vbs, which also degrades the harmonic linearity of the sampling circuit. Moreover, this approach needs a voltage DAC capable of powering the bootstrap circuit, at the expense of valuable power and area.

Hence, there is a need for a technique for tuning sampling bandwidth in interleaved ADCs which a) does not degrade linearity across an input frequency range of interest, b) does not degrade sampling harmonic distortion by reducing the bootstrap voltage, c) does not require significant circuit overhead, for example additional voltage DACs or other complex circuitry and d) tunes the gate voltage of the sampling switch in track mode to directly change on-resistance of the sampling switches.

SUMMARY

It is an object of embodiments of the present disclosure to describe a sample-and-hold circuit that can be used in an interleaved ADC for tuning the sampling bandwidth and that meets one or more of the above-mentioned requirements. It is a further object to provide for an interleaved ADC comprising such a sample-and-hold circuit.

The above objective is accomplished by embodiments described in the present disclosure.

In a first aspect the disclosure relates to a sample-and-hold circuit comprising a transistor arranged for switching between a sample mode and a hold mode, and a bootstrap circuit arranged for maintaining in the sample mode a voltage level between a source terminal and a gate terminal of the transistor independent of the voltage at the source terminal and arranged for switching off the transistor in the hold mode. The bootstrap circuit comprises a bootstrap capacitance arranged for being precharged to a given voltage during the hold mode, the bootstrap capacitance being connected between the source terminal and the gate terminal during the sample mode. The sample-and-hold circuit is characterized in that the bootstrap circuit comprises a switched capacitor charge pump for generating that given voltage.

Since embodiments herein essentially affect the voltage to precharge the bootstrap capacitance, they allow for tuning of the sampling bandwidth without degrading linearity at any frequency. Moreover, described embodiments do not degrade harmonic distortion, if the voltage to precharge the bootstrap capacitance is at least equal to the supply voltage. Embodiments herein are further implemented with low overhead as they do not require additional complex circuitry, such as a voltage DAC etc. Example embodiments also directly compensate for bandwidth mismatch by tuning the track-mode gate voltage of the sampling switch, which changes the on-resistance of the sampling switch.

In an example embodiment the switched capacitor charge pump is programmable.

Additionally or alternatively, the switched capacitor charge pump comprises a first and a second capacitor.

In one embodiment the second capacitor is programmable.

In one embodiment the first capacitor is arranged to be charged to a supply voltage and the second capacitor is arranged for being discharged, whereby the first and second capacitor are arranged for being connected in parallel to generate the given voltage through charge redistribution. In an example embodiment the first and second capacitors are then arranged to be charged and discharged during the sample mode and connected in parallel during the hold mode.

In another embodiment the first and second capacitor are arranged to be charged to a supply voltage and arranged for being connected in series to generate the given voltage through charge redistribution. The first and second capacitors are arranged to be charged during the sample mode and connected in series during the hold mode.

In an example embodiment the bootstrap capacitance is connectable between the source terminal and the gate terminal via a plurality of transistors arranged for dividing a voltage difference over the transistor terminals.

In another aspect, the disclosure relates to a time-interleaved analog-to-digital converter comprising a plurality of channels, whereby each channel comprises a sample-and-hold circuit as previously described.

For purposes of summarizing the disclosure and the aspects achieved over the prior art, certain objects and aspects of the present systems, devices and methods have been described herein above. Of course, it is to be understood that not necessarily all such objects or aspects may be achieved in accordance with any particular embodiment of the present disclosure. Thus, for example, those skilled in the art will recognize that various systems and devices described herein may be embodied or carried out in a manner that achieve or optimize one aspect or a group of aspects as taught herein without necessarily achieving other objects or aspects as may be taught or suggested herein.

The aforementioned aspects and further aspects will be apparent from and elucidated with reference to the embodiment(s) described in the present disclosure.

BRIEF DESCRIPTION OF THE FIGURES

The present disclosure will now be described further, by way of example, with reference to the accompanying drawings, wherein like reference numerals refer to like elements in the various figures.

DETAILED DESCRIPTION

Figure 1:
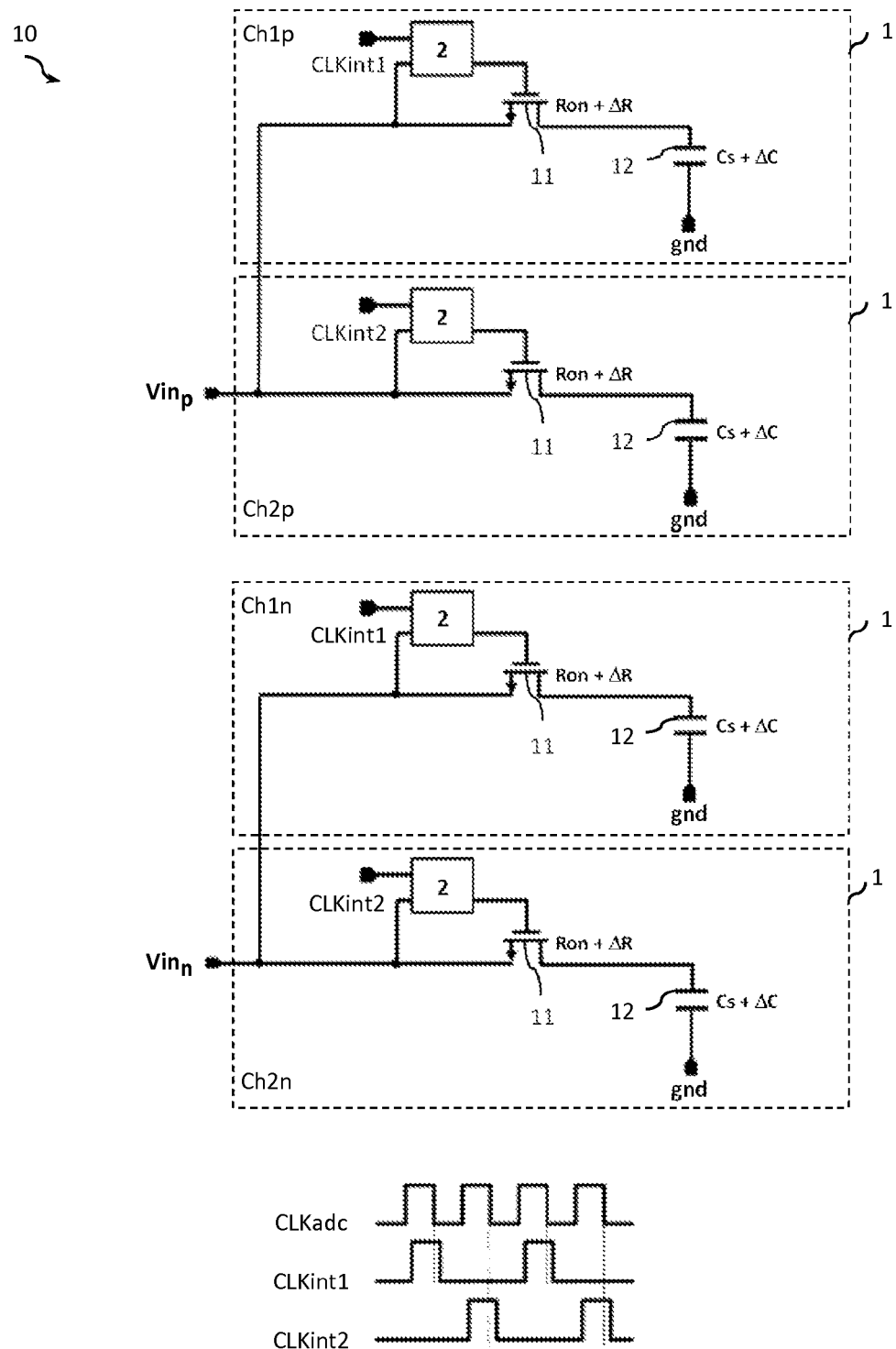
FIG. 1 illustrates a sampling stage for a typical two-times interleaved A/D converter.

The present disclosure will be described with respect to particular embodiments and with reference to certain drawings but the disclosure is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various embodied aspects. This method of disclosure, however, is not to be interpreted as reflecting an intention that the claimed subject matter requires more features than are expressly recited in each claim. Rather, as the following claims reflect, some embodied aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Designing a highly linear sampling network for an interleaved ADC requires consideration of two different distortion effects. First and foremost the harmonic distortion in each individual channel has to be sufficiently low. In the frequency domain this harmonic distortion shows up as spurious tones at multiples of the sampling frequency, potentially aliased down to lower digital output frequencies. Harmonic distortion can be reduced by using a bootstrap circuit to provide a high and signal-independent gate-source voltage for the sampling switches. Second, all interleaved sampling circuits should have the same bandwidth to avoid bandwidth mismatch spurs. Reducing these spurs requires either ensuring a sufficiently small inherent bandwidth variation of the sampling circuit or implementing controllable bandwidth for these sampling circuits. These requirements can be translated into requirements for the bootstrap voltage Vbs=Cbs/(Cbs+Cpar)*(Vch+Vin). This bootstrap voltage must be high to ensure sufficiently low harmonic distortion and it must be tunable to allow matching between the sampling circuits of the interleaved channels. As explained previously, tuning any part of the term Cbs/(Cbs+Cpar) as in US2013/141261 is undesirable as it results in calibration-dependent gain mismatch between channels.

In the present disclosure the bandwidth mismatch is calibrated by tuning the signal-independent part of Vbs, that is by tuning the Vch applied at the bootstrap capacitor 21. A signal-independent tuning is thus achieved which avoids linearity degradation caused by interleaving spurs after bandwidth mismatch calibration. Some embodiments of the present disclosure accomplish tuning of Vch by using a switched capacitor charge pump 22. A significant circuit overhead is avoided, as no voltage DACs or other complex circuitry is required. In addition, sampling bandwidth reduction is avoided by boosting Vch above the nominal supply Vdd, while avoiding reliability issues.

Figure 3:
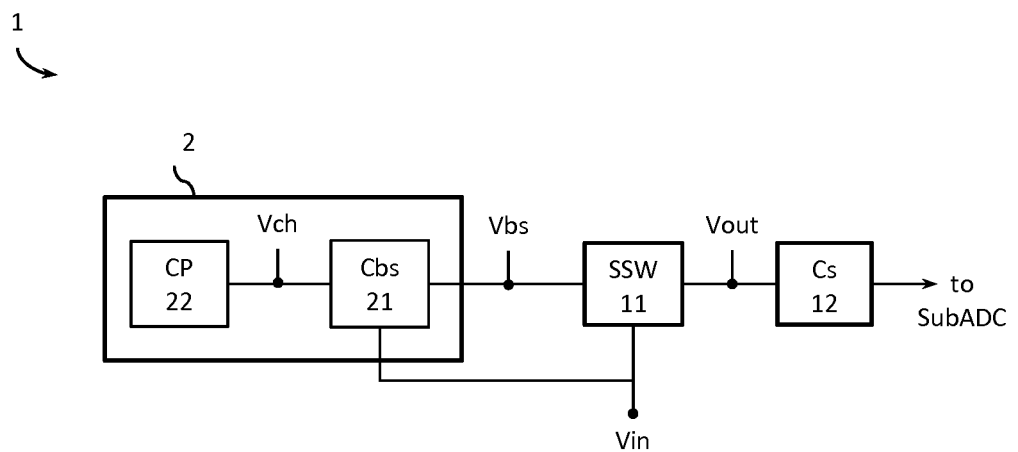
FIG. 3 represents a generic block scheme of a sample-and-hold circuit according to an example embodiment.

The approach adopted here is shown in FIG. 3, which provides a general block scheme of a sample-and-hold circuit 1 according to an example embodiment. The scheme comprises a sampling transistor 11, a sampling capacitor Cs 12 and a bootstrap circuit 2. The bootstrap circuit comprises a bootstrap capacitance 21 and a capacitive charge-pump (CP) 22. The bootstrap capacitance (Cbs) 21 is precharged during the hold phase to a Vch using the charge-pump. During the tracking phase the bootstrap capacitance is connected between the source and the gate voltage of the sampling transistor 11 to provide a gate-source voltage Vgs independent of the source voltage (equivalent to Vin). During the hold phase the sampling transistor is switched off, thereby holding the acquired voltage Vin on the sampling capacitor 12.

Figure 4:
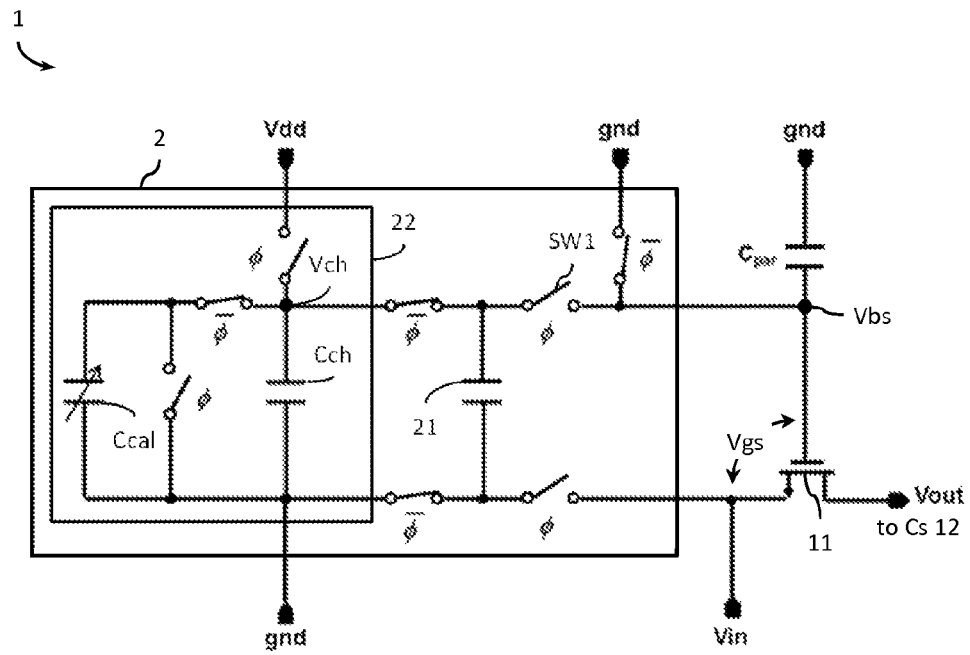
FIG. 4 illustrates an embodiment of the sample-and-hold circuit according to an example embodiment.

FIG. 4 shows a simplified implementation of Vch calibration. To generate Vch for bandwidth calibration, a two phase operation of the charge pump 22 is required. During the tracking phase (when $\phi=1$) capacitor Cch is charged to the supply voltage Vdd and capacitor Ccal is charged to 0 V. During the hold phase ($\phi=0$) both Cch and Ccal are connected in parallel to Cbs to create a Vch which obviously depends on the values of Cch and Ccal. To achieve a high value for Vch, Ccal should be small compared to Cch and Cbs, which is generally beneficial for harmonic distortion as explained below. Herein, tuning of Vch is achieved by tuning the Ccal. Adjusting the Vch in this way, however, does not change the input dependent part of Vbs when the sampling switch overdrive is changed, contrary to tuning of Cbs. Moreover, since only a tunable capacitor (i.e. Ccal) is required, this tuning method for Vch can be implemented with negligible overhead.

Figure 5:
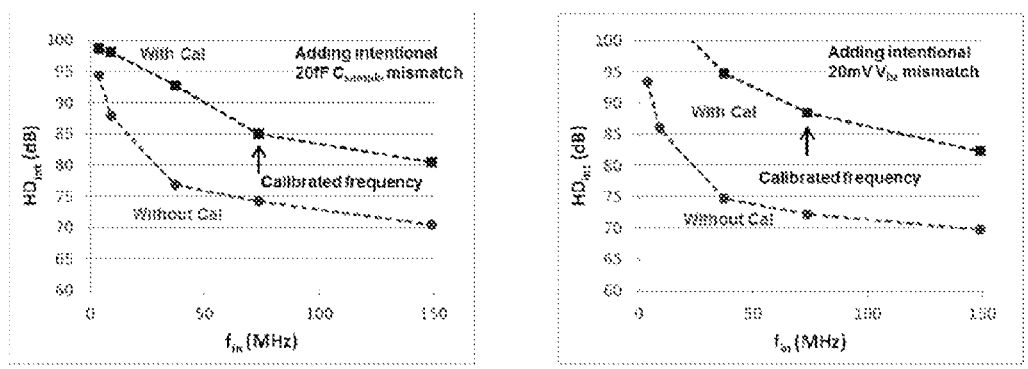
FIG. 5 illustrates simulation results of the interleaving spur magnitude (HDint) as a function of the input frequency $f_{in}$ for a sampling capacitor mismatch (left plot) and for a bootstrap voltage mismatch (right plot).

FIG. 5 shows simulation results of the interleaving spur magnitude $HD_{int}$ due to bandwidth mismatch as a function of the input frequency $f_{in}$ for a sampling capacitor mismatch of 20 fF (left plot) and for a bootstrap voltage mismatch of 20 mV (right plot). The mismatch calibration has been performed for an input frequency of 75 MHz. The simulation results clearly show no degradation in the magnitude of the interleaving spur across any input frequency. The simulation results clearly show that the embodiments herein achieve a signal independent bandwidth mismatch calibration.

Figure 2:
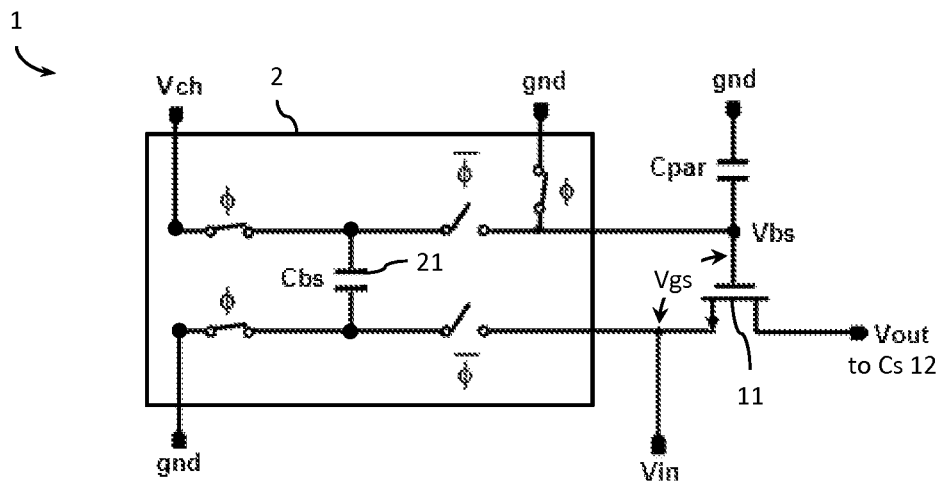
FIG. 2 illustrates a bootstrap circuit as commonly used in high performance ADCs.
Figure 6:
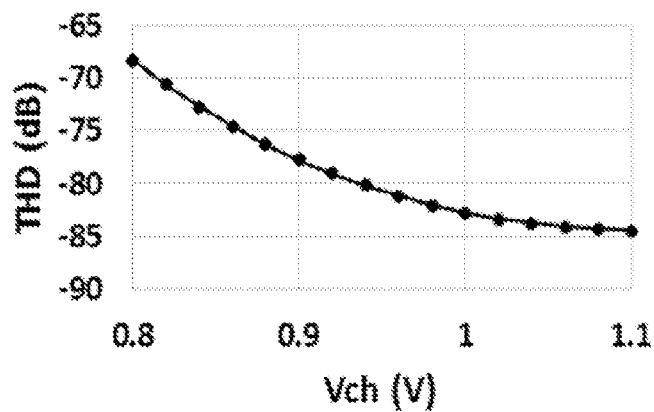
FIG. 6 illustrates a simulation result of the total harmonic distortion (THD) as a function of the overdrive voltage Vch.

Generally, the on-resistance of sampling transistor 11 can be decreased with a larger overdrive voltage, which can improve the linearity of the single channel sampling stage. In practice, during the Vbs generation in FIG. 4, this overdrive value is reduced compared to the conventional bootstrap circuit of FIG. 2. This results in increased harmonic distortion for each individual channel of the interleaved converter. This is illustrated in FIG. 6, which shows simulation results of the total harmonic distortion (THD) for a given sampling transistor size as a function of Vch.

Figure 7:
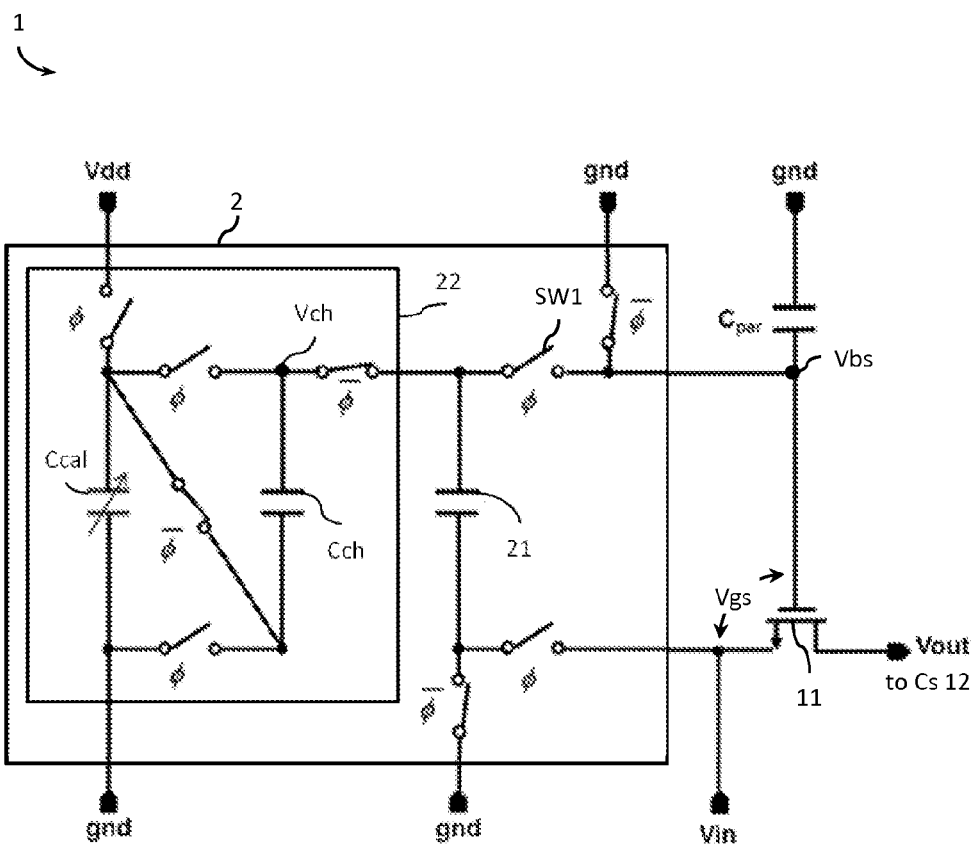
FIG. 7 illustrates a sample-and-hold circuit according to an example embodiment.
Figure 8:
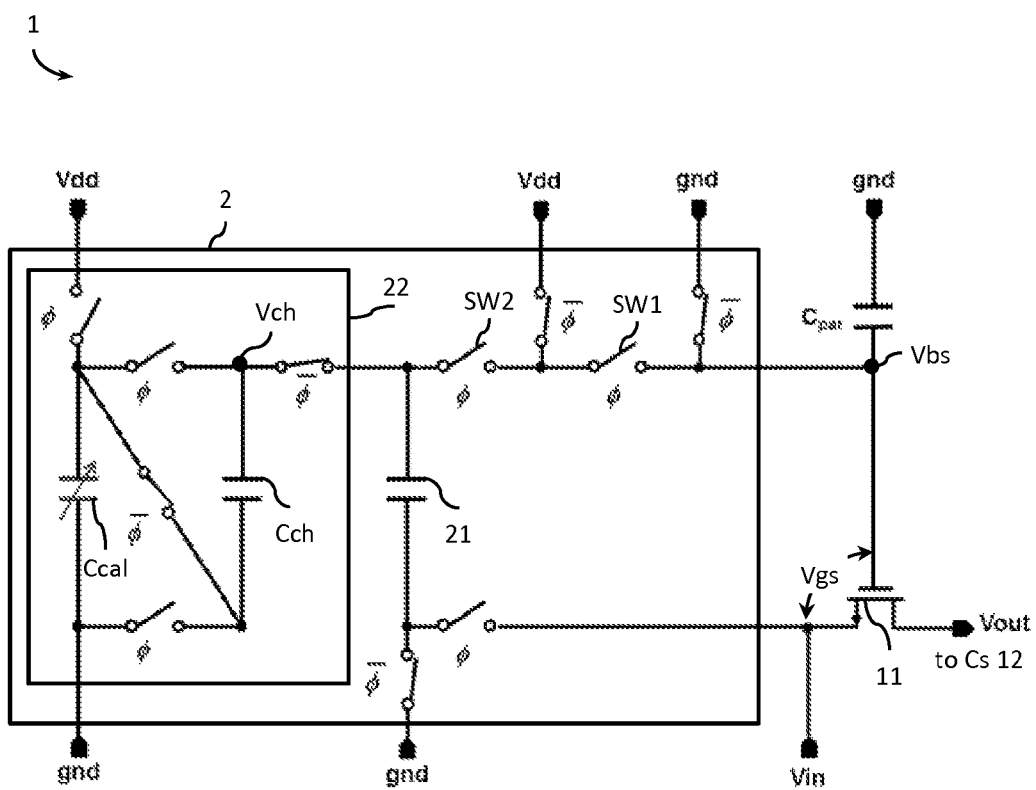
FIG. 8 illustrates a sample-and-hold circuit according to an example embodiment.

The scheme shown in FIG. 7 overcomes the drawback of the reduced overdrive value, by generating a Vch voltage at least equal to or above the supply voltage Vdd. When $\phi=1$, both capacitors Ccal and Cch are charged to Vdd and the sampling transistor 11 is in tracking mode. During the hold phase (i.e. when $\phi=0$) both Ccal and Cch are connected in series to the bootstrap capacitor 21 to charge the latter. In other words, the Vch voltage is generated by a charge pump comprising the series connection of Cch and Ccal. By changing Ccal, the voltage on Cbs at the end of $\phi=0$ can be changed. For sufficiently large values of Ccal and Cch, the bootstrap capacitor 21 is thus charged to a voltage Vch above Vdd. By tuning the Ccal value and optimizing the capacitor ratios between Ccal, Cch, Cbs and Cpar, the gate-source voltage Vgs of sampling switch transistor 11 can be brought very close to Vdd without exceeding Vdd. Even if Vgs does not exceed Vdd, a potential reliability issue remains with respect to switch SW1 shown connected between Vch and Vbs in FIG. 7. During the hold phase (when $\phi=0$), one side of SW1 is connected to ground and the other side connected to Vch which is larger than the supply voltage Vdd. The switch SW1 usually comprises a transistor. In many cases the source-drain voltage Vds of that transistor is required to be smaller than the supply voltage to avoid hot carrier injection. In order to overcome this reliability issue, another switch (SW2) can be added in series to SW1 as shown in FIG. 8. During the hold phase SW2 is connected to Vch and Vdd and SW1 is connected to Vdd and ground. In this case, the source-drain voltage of each switch, SW1 and SW2, is less than Vdd. In an example embodiment, all switches in the circuit shown in FIG. 8 may be implemented with transistors without any reliability concern. In addition, the implementation of FIG. 8 allows for further improvement of the sampling circuit linearity, by providing an even higher gate voltage (i.e. Vbs>>Vdd) to the sampling switch, which in turn further lowers its on-resistance.

The disclosure may describe desired properties for a highly linear sampler for interleaved ADCs. It enables bandwidth tuning without adding parasitic gain mismatch by changing Vch rather than a capacitor ratio. It does so by changing the track-mode gate voltage of the sampling switch, which provides good cancellation of mismatch effects across clock and input frequencies. It further avoids the need for a voltage DAC, relying instead on some programmable capacitors, which are significantly easier to implement. Finally, with proper design the configuration of FIG. 7 provides the highest gate-source voltage that can safely be achieved on a sampling switch, which significantly improves harmonic distortion of the sampling.

While the disclosure has been illustrated and described in detail in the drawings and foregoing description, such illustration and description are to be considered illustrative or exemplary and not restrictive. The foregoing description details certain embodiments of the disclosure. It will be appreciated, however, that no matter how detailed the foregoing appears in text, the subject matter of the disclosure may be practiced in many ways. The scope of the present disclosure is not limited to the described embodiments.

Other variations to the disclosed embodiments can be understood and effected by those skilled in the art in practicing the claimed subject matter, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:
1. A sample-and-hold circuit comprising
a transistor arranged for switching between a sample mode and a hold mode; and a bootstrap circuit arranged for maintaining in the sample mode a voltage level between a source terminal and a gate terminal of the transistor independent of the voltage at the source terminal and arranged for switching off the transistor in the hold mode, the bootstrap circuit comprising a bootstrap capacitance arranged for being precharged to a given charge voltage during the hold mode, the bootstrap capacitance being connected between the source terminal and the gate terminal during the sample mode, wherein the bootstrap circuit comprises a programmable switched capacitor charge pump for generating the given charge voltage to which the bootstrap capacitance is precharged.

2. The sample-and-hold circuit as in claim 1, wherein the programmable switched capacitor charge pump comprises a first capacitor and a second capacitor.

3. The sample-and-hold circuit as in claim 2, wherein the second capacitor is programmable.

4. The sample-and-hold circuit as in claim 2, wherein the first capacitor is arranged to be charged to a supply voltage and the second capacitor is arranged for being discharged, the first and second capacitors arranged for being connected in parallel to generate the given charge voltage through charge redistribution.

5. The sample-and-hold circuit as in claim 4, wherein the first and second capacitors are arranged to be charged and discharged during the sample mode and connected in parallel during the hold mode.

6. The sample-and-hold circuit as in claim 2, wherein the first and second capacitor are arranged to be charged to a supply voltage (Vdd) and arranged for being connected in series to generate the given charge voltage through charge redistribution.

7. The sample-and-hold circuit as in claim 6, wherein the first and second capacitors are arranged to be charged during the sample mode and connected in parallel during the hold mode.

8. The sample-and-hold circuit as in claim 6, wherein the bootstrap capacitance is connectable between the source terminal and the gate terminal via a plurality of transistors arranged for dividing a voltage difference over the transistor terminals.

9. A time-interleaved analog-to-digital converter, ADC, comprising a plurality of channels each comprising the sample-and-hold circuit as in claim 1.

10. The sample-and-hold circuit as in claim 1, wherein, during the hold mode, the programmable switched capacitor charge pump is arranged to be coupled to the bootstrap capacitance.

11. The sample-and-hold circuit as in claim 1, wherein, during the sample mode, the programmable switched capacitor charge pump is arranged to be decoupled from the bootstrap capacitance.

12. The sample-and-hold circuit as in claim 1, wherein the bootstrap capacitance is connectable between the source terminal and the gate terminal via a plurality of transistors arranged for dividing a voltage difference over the transistor terminals.

13. The sample-and-hold circuit as in claim 2, wherein the bootstrap capacitance comprises a bootstrap capacitor, and wherein the first capacitor, the second capacitor, and the bootstrap capacitor are distinct capacitors.

14. The sample-and-hold circuit as in claim 13, wherein, during the hold mode, the programmable switched capacitor charge pump is arranged to be coupled to the bootstrap capacitor.

15. The sample-and-hold circuit as in claim 13, wherein, during the sample mode, the programmable switched capacitor charge pump is arranged to be decoupled from the bootstrap capacitor.

16. The sample-and-hold circuit as in claim 13, wherein, during the hold mode, the first capacitor, the second capacitor, and the bootstrap capacitor are coupled in parallel.

17. The sample-and-hold circuit as in claim 13, wherein, during the sample mode, the first capacitor and second capacitor are coupled in a series combination, wherein, during the sample mode, the series combination is coupled in parallel with the bootstrap capacitor, and wherein, during the hold mode, the first and second capacitors are coupled in parallel.

* * * * *